(12) United States Patent
Jin et al.

(10) Patent No.: US 9,961,800 B2
(45) Date of Patent: May 1, 2018

(54) LIQUID COOLING APPARATUS

(71) Applicant: Huawei Technologies Co., Ltd., Shenzhen, Guangdong (CN)

(72) Inventors: Youlin Jin, Shenzhen (CN); Taqing Feng, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 330 days.

(21) Appl. No.: 14/518,614

(22) Filed: Oct. 20, 2014

(65) Prior Publication Data

US 2015/0034271 A1 Feb. 5, 2015

Related U.S. Application Data

(63) Continuation of application No. PCT/CN2012/086285, filed on Dec. 10, 2012.

(30) Foreign Application Priority Data

Apr. 20, 2012 (CN) .......................... 2012 1 0118942

(51) Int. Cl.
*H05K 7/20* (2006.01)
*F28F 27/00* (2006.01)

(52) U.S. Cl.
CPC ......... *H05K 7/20509* (2013.01); *F28F 27/00* (2013.01); *H05K 7/20272* (2013.01);
(Continued)

(58) Field of Classification Search
CPC .................. F28F 2275/22; H01L 23/40; H01L 2224/75734; H01L 2224/75735;
(Continued)

(56) References Cited

U.S. PATENT DOCUMENTS 4,669,791 A * 6/1987 Savill ...................... B60T 17/04
439/132
4,710,136 A * 12/1987 Suzuki ................. H05K 5/0204
165/185

(Continued)

FOREIGN PATENT DOCUMENTS

CN 2691053 Y 4/2005
CN 2783401 Y 5/2006
(Continued)

*Primary Examiner* — Hung Q Nguyen
*Assistant Examiner* — Mark L Greene

(57) ABSTRACT

Embodiments of the present invention disclose a liquid cooling apparatus, which includes a cold plate (202), a fast connector (204), and a first interface (2011), where the fast connector (204) includes a first connector (2041) and a second connector (2042), where the first connector (2041) is fixedly connected to the cold plate (202); the first interface (2011) is configured to connect to a second interface (2012) corresponding to the first interface; and the liquid cooling apparatus further includes a guide rail (203), where the guide rail (203) is a moving rail of the second connector (2042), and when the first connector (2041) and the second connector (2042) are in a connected state and the second connector (2042) is located at an end on the guide rail (203) that is close to a board (201), a distance between the first interface (2011) and the second interface (2012) is greater than 0.

4 Claims, 2 Drawing Sheets

(52) U.S. Cl.
CPC ...... *H05K 7/20636* (2013.01); *F28F 2265/00* (2013.01); *F28F 2275/22* (2013.01)

(58) Field of Classification Search
CPC .............. F16L 37/004; H05K 7/20254; H05K 7/20272; H05K 7/20509; H05K 7/20636; H05K 7/20781
USPC ............. 62/259.2; 439/190–206, 377, 541.5, 439/607.35, 620.06, 620.12, 620.15, 439/620.22, 629, 876; 174/11 R; 361/724–728, 748, 760; 165/80.1, 80.4, 165/104.19, 104.31, 104.33, 185; 285/9.1
See application file for complete search history.

(56) References Cited

U.S. PATENT DOCUMENTS

| | | | | |
|---|---|---|---|---|
| 6,746,212 B2* | 6/2004 | Payne | ................... | F04B 17/044 |
| | | | | 417/53 |
| 6,807,056 B2* | 10/2004 | Kondo | ...................... | G06F 1/20 |
| | | | | 165/104.33 |
| 6,817,204 B2* | 11/2004 | Bash | ......................... | G06F 1/20 |
| | | | | 165/104.33 |
| 7,542,285 B2* | 6/2009 | Colucci | ..................... | G06F 1/20 |
| | | | | 165/104.33 |
| 2003/0030981 A1 | 2/2003 | Zuo et al. | | |
| 2006/0065874 A1 | 3/2006 | Campbell et al. | | |
| 2006/0130496 A1* | 6/2006 | Chapman | ............ | F24F 11/0086 |
| | | | | 62/126 |
| 2008/0110594 A1 | 5/2008 | Martin et al. | | |
| 2009/0260777 A1 | 10/2009 | Attlesey | | |
| 2011/0313576 A1* | 12/2011 | Nicewonger | ........... | F28D 15/00 |
| | | | | 700/282 |
| 2012/0069519 A1 | 3/2012 | Caron et al. | | |
| 2017/0257980 A1* | 9/2017 | Fukunaga | ........... | H05K 7/20272 |

FOREIGN PATENT DOCUMENTS

| | | |
|---|---|---|
| CN | 101179920 A | 5/2008 |
| CN | 101452325 A | 6/2009 |
| CN | 101730453 A | 6/2010 |
| CN | 201601940 U | 10/2010 |
| CN | 102711414 A | 10/2012 |
| EP | 2 400 828 A1 | 12/2011 |
| TW | 595757 U | 6/2004 |
| WO | WO 2012/014058 A1 | 2/2012 |

* cited by examiner

LIQUID COOLING APPARATUS

CROSS-REFERENCE TO RELATED APPLICATIONS

This application is a continuation of International Application No. PCT/CN2012/086285, filed on Dec. 10, 2012, which claims priority to Chinese Patent Application No. 201210118942.0, filed on Apr. 20, 2012, both of which are hereby incorporated by reference in their entireties.

TECHNICAL FIELD

The present invention relates to the field of communications technologies, and in particular, to a liquid cooling apparatus.

BACKGROUND

With development of communications service traffic, power consumption of a board becomes higher and higher. As a technology with a superb heat dissipation effect, liquid cooling heat dissipation will become a preferred solution to address high heat production. Because of a need of flexible product service configuration, maintenance, and upgrade, a board needs to have a hot swap function.

As shown in FIG. 1, which is a schematic structural diagram of a system loop of a liquid cooling apparatus, the system loop includes: aboard 101, a cold plate 102, a fast connector 103, a hose 104, a pump 105, and a heat sink 106. The board 101 is a heat source. The cold plate 102 generally has metal plates and pipes, and liquid can flow inside the cold plate 102. The cold plate 102 is closely attached to the board 101 to absorb heat of the board 101. The cold plate 102 is connected to the fast connector 103 and the pump 105 through the hose 104. The pump 105 is connected to the heat sink 106 through the hose 104. The pump 105, the heat sink 106, the fast connector 103, and the cold plate 102 are connected in serial mode through the hose to form an enclosed loop. The pump 105 provides a driving force for liquid to flow in the enclosed loop. Low-temperature liquid enters the cold plate 102, absorbs heat of the board 101, and becomes high-temperature liquid; the high-temperature liquid enters the heat sink 106 after flowing out of the cold plate 102; the high-temperature liquid releases heat in the heat sink 106 and becomes low-temperature liquid; and the low-temperature liquid flows out of the heat sink 106 and enters the cold plate 102 again, thereby forming a circle. The board 101 has an interface and may be inserted in a slot. After being inserted in a slot and powered on, the board 101 enters a ready-to-work state.

Because of a need of flexible product service configuration, maintenance, and upgrade, the board generally has a hot swap function. A liquid cooling loop also needs to be connected or disconnected (inserting the hose 104 or removing the fast connector 103) when the board is inserted or removed. According to current operation specifications and requirements, the liquid cooling loop is connected before the board is inserted, and the liquid cooling loop is disconnected after the board is removed. Currently, the insertion and removal of the board and the connection and disconnection of the liquid cooling loop are all manual operations, which are liable to a reverse sequence. Equipment may fail to work normally or even be severely damaged due to misoperation. Therefore, equipment reliability is low.

SUMMARY

Embodiments of the present invention provide a liquid cooling apparatus, which is used to reduce misoperation and improve equipment reliability.

A liquid cooling apparatus includes a cold plate, a fast connector, and a first interface, where:
the fast connector includes a first connector and a second connector, where the first connector is fixedly connected to the cold plate; the first interface is configured to connect to a second interface corresponding to the first interface; and the liquid cooling apparatus further includes a guide rail, where the guide rail is a moving rail of the second connector; and
when the first connector and the second connector are in a connected state and the second connector is located at an end on the guide rail that is close to the board, a distance between the first interface and the second interface is greater than 0.

It can be seen from the foregoing technical solution that, the embodiments of the present invention have the following advantage: Insertion or removal can be performed by only manually inserting a board along a slot on equipment, without requiring a person to operate and control an insertion or removal sequence, thereby reducing misoperation and improving equipment reliability.

BRIEF DESCRIPTION OF THE DRAWINGS

To describe the technical solution in the embodiments of the present invention more clearly, the following briefly introduces the accompanying drawings required for describing the embodiments. Apparently, the accompanying drawings in the following description show merely some embodiments of the present invention, and persons of ordinary skill in the art may still derive other drawings from these accompanying drawings without creative efforts.

DETAILED DESCRIPTION

To make the objective, technical solution, and advantage of the present invention clearer, the following further describes the present invention in detail with reference to the accompanying drawings. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

Figure 1:
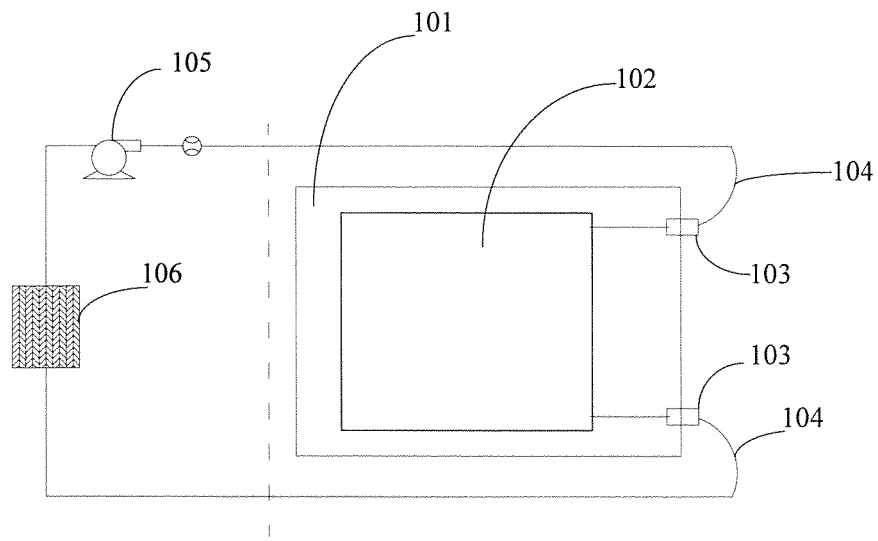
FIG. 1 is a schematic structural diagram of a liquid cooling system loop in the prior art.
Figure 2:
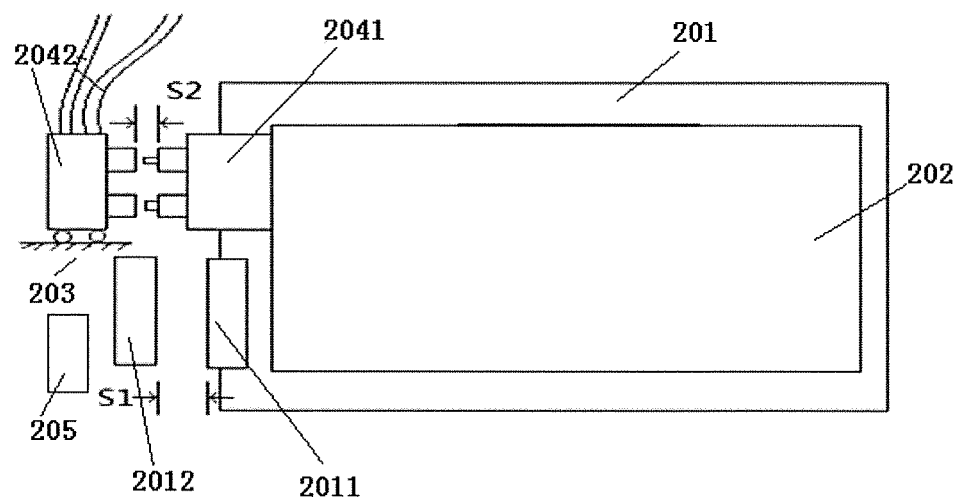
FIG. 2 is a schematic structural diagram after a liquid cooling apparatus according to an embodiment of the present invention is removed.
Figure 3:
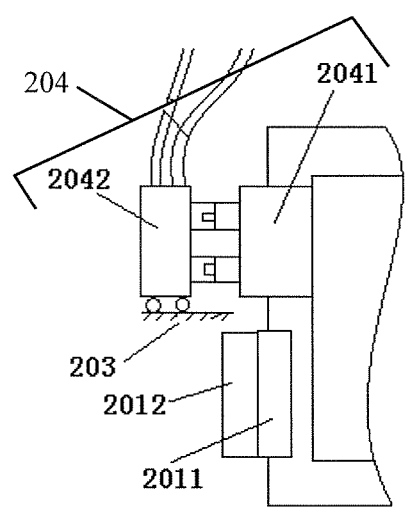
FIG. 3 is a schematic structural diagram after a liquid cooling apparatus according to an embodiment of the present invention is inserted.

An embodiment of the present invention provides a liquid cooling apparatus, as shown in FIGS. 2 and 3. Referring to FIG. 3, the liquid cooling apparatus includes a cold plate 202, a fast connector 204, and a first interface 2011.

The fast connector 204 includes a first connector 2041 and a second connector 2042. The first connector 2041 is fixedly connected to the cold plate 202. The first interface 2011 is configured to connect to a second interface 2012 corresponding to the first interface. The liquid cooling apparatus further includes a guide rail 203.

The guide rail 203 is a moving rail of the second connector 2042.

When the first connector 2041 and the second connector 2042 are in a connected state and the second connector 2042 is located at an end on the guide rail 203 that is close to the board 201, a distance between the first interface 2011 and the second interface 2012 is greater than 0 (S1>S2, as shown in FIG. 2).

Furthermore, the liquid cooling apparatus further includes a board 201.

The cold plate 202 is attached to the board 201 for cooling the board 201. The first interface 2011 is fixedly connected to the board 201. It should be noted that, the board 201 is a board with a heat source component, and the liquid cooling apparatus dissipates heat for the board 201, but the board 201 is not a mandatory part of the liquid cooling apparatus.

Furthermore, the liquid cooling apparatus further includes a liquid cooling control module and an electromagnet 205.

The liquid cooling control module is configured to: when the first connector 2041 and the second connector 2042 are in a disconnected state, control the electromagnet 205 to attract the second connector 2042, so that the second connector 2042 is fixed on the guide rail 203; and when the first connector 2041 and the second connector 2042 are is a connected state, control the electromagnet 205 not to attract the second connector.

More specifically, the liquid cooling control module is configured to: when the first connector 2041 and the second connector 2042 are in a disconnected state, control the electromagnet 205 to enter a working state (that is, a power-on state, in which the electromagnet 205 will generate attraction to the second connector 2042), where the electromagnet 205 in a working state attracts the second connector 2042 to fix the second connector 2042 on the guide rail 203; and when the first connector 2041 and the second connector 2042 are in a connected state, control the electromagnet 205 to enter an idle state.

The liquid cooling control module and the electromagnet 205 implement an automatic switching between a fixed connection and an adjustable connection of the second connector 2042, which can further reduce manual operations. An implementation manner for the liquid cooling control module to monitor whether the first connector 2041 and the second connector 2042 are in a connected state may be to monitor whether a liquid cooling loop constitutes a loop, or the monitoring may be implemented in another manner, which is not limited in the embodiment of the present invention.

Furthermore, the liquid cooling apparatus further includes a liquid cooling indicator. The liquid cooling control module is further configured to: when the first connector 2041 and the second connector 2042 are in a connected state, control the liquid cooling indicator to become on; and when the first connector 2041 and the second connector 2042 are in a disconnected state, control the liquid cooling indicator to become off.

Using a circuit indicator and a circuit control module can implement a function of indicating a connection and disconnection of the liquid cooling loop, making it convenient for an operator to view an operation state and an operation result.

Furthermore, the liquid cooling apparatus further includes:

the circuit indicator and the circuit control module, where the circuit control module is configured to: when the first interface 2011 and the second interface 2012 are in a connected state, control the circuit indicator to become on; and when the first interface 2011 and the second interface 2012 are in a disconnected state, control the circuit indicator to become off.

Using the circuit indicator and the circuit control module can implement a function of indicating a connection and disconnection of a circuit, making it convenient for an operator to view an operation state and an operation result. An implementation manner to monitor whether the first interface 2011 and the second interface 2012 are in a connected state may be to monitor whether a board is powered on, or the monitoring may be implemented in another manner, which is not limited in the embodiment of the present invention.

Preferably, the fast connector is a fast connector with a self-guide and/or self-lock function.

The following describes an operating principle of the liquid cooling apparatus provided by the embodiment of the present invention in detail:

1. Board insertion process:

Initial state: As shown in FIG. 2, a first connector 2041 and a second connector 2042 are in a separate state. Therefore, an electromagnet 205 is in a working state, and the second connector 2042 is fixed on a guide rail 203, as S1>S2 shown in FIG. 2.

A liquid cooling loop connected: After the first connector 2041 and the second connector 2042 are connected, the first connector 2041 and the second connector 2042 are in a connected state, the electromagnet 205 stops working, and the second connector 2042 is in a movable state. At this time, a liquid cooling indicator becomes on. Because S1>S2, a first interface 2011 and a second interface 2012 are still not in contact at this time.

A board 201 inserted: As shown in FIG. 3, the board 201 and a cold plate 202 are pushed, and the second connector 2042 slides on the guide rail 203 to a left side of the guide rail 203; and the first interface 2011 and the second interface 2012 are connected to power on the board. At this time, a circuit indicator becomes on.

2. Board removal process:

The removal process is a reverse process of the board insertion process and is specifically as follows:

The board 201 removed: The board 201 moves to the right, the first interface 2011 and the second interface 2012 are separate, and the circuit indicator becomes off; the second connector 2042 slides on the guide rail 203 to a right side of the guide rail 203; and because S1>S2, the first connector 2041 and the second connector 2042 are still in a connected state at this time.

The liquid cooling loop disconnected: The board 201 continuously moves to the right, the first connector 2041 and the second connector 2042 are separate, and the liquid cooling indicator becomes off; and because the first connector 2041 and the second connector 2042 are separate, the electromagnet 205 starts working and attracts the second connector 2042 to fix the second connector 2042 on the guide rail. Finally, a state shown in FIG. 2 is formed.

In the process, insertion or removal can be performed by only manually inserting the board along a slot on equipment, without requiring a person to control an insertion or removal sequence, thereby reducing misoperation and improving equipment reliability. A guide pin may further be disposed in a direction of inserting the board to facilitate alignment between the first connector 2041 and the second connector 2042, and between the first interface 2011 and the second interface 2012.

It should be noted that, the circuit control module and the liquid cooling control module are merely divided based on functional logic, but are not limited to the preceding division, and any other division is acceptable as long as corresponding functions can be implemented. In addition, specific names of functional units are merely for mutual distinction, but are not intended to limit the protection scope of the present invention.

In addition, a person of ordinary skill in the art may understand that all or a part of the steps of the method embodiments may be implemented by a program instructing relevant hardware. The program may be stored in a computer readable storage medium. The storage medium may include: a read-only memory, a magnetic disk, or an optical disc.

The foregoing descriptions are merely specific exemplary embodiments of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A liquid cooling apparatus, comprising:
    a board;
    a cold plate attached to the board, the cold plate configured to cool the board;
    a fast connector comprising a first connector and a second connector, wherein the first connector is fixedly connected to the cold plate;
    a first interface fixedly connected to the board, the first interface configured to connect to a second interface;
    a guide rail in contact with the second connector, the guide rail having a first end and a second end, the first end being closer to the board than the second end, wherein the second connector is configured to move along the guide rail;
    an electromagnet; and
    a liquid cooling control module configured to:
        when the first connector and the second connector are in a disconnected state, control the electromagnet to attract the second connector, so that the second connector is fixed on the guide rail, and
        when the first connector and the second connector are in a connected state, control the electromagnet to not attract the second connector,
    wherein when the first connector and the second connector are in the connected state and the second connector is located at the first end of the guide rail that is closer to the board, the first interface and the second interface are separated such that the first interface does not contact the second interface.

2. The liquid cooling apparatus according to claim 1, further comprising:
    a liquid cooling indicator; and
    the liquid cooling control module is further configured to:
        when the first connector and the second connector are in the connected state, control the liquid cooling indicator to turn on, and
        when the first connector and the second connector are in the disconnected state, control the liquid cooling indicator to turn off.

3. The liquid cooling apparatus according to claim 1, further comprising:
    a circuit indicator; and
    a circuit control module configured to:
        when the first interface and the second interface are in the connected state, control the circuit indicator to turn on, and
        when the first interface and the second interface are in the disconnected state, control the circuit indicator to turn off.

4. The liquid cooling apparatus according to claim 1, wherein the fast connector comprises at least one of a self-guide and a self-lock function.

* * * * *